(12) United States Patent
Chaudhari et al.

(10) Patent No.: US 12,222,543 B2
(45) Date of Patent: Feb. 11, 2025

(54) HIGH REFRACTIVE INDEX NANOIMPRINTABLE RESIN FOR OPTICAL WAVEGUIDE APPLICATIONS

(71) Applicant: MICROSOFT TECHNOLOGY LICENSING, LLC, Redmond, WA (US)

(72) Inventors: Atul Bhaskar Chaudhari, Uusimaa (FI); Klaus Henrik Valtteri Kalima, Uusimaa (FI); Mervi Kaarina Ylä-Jarkko, Hämeenlinna (FI); Pasi Petteri Heinonen, Uusimaa (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 167 days.

(21) Appl. No.: 17/989,920

(22) Filed: Nov. 18, 2022

(65) Prior Publication Data

US 2024/0168227 A1 May 23, 2024

(51) Int. Cl.
*G02B 6/122* (2006.01)
*B82Y 20/00* (2011.01)
*G02B 6/12* (2006.01)
*G02B 6/134* (2006.01)

(52) U.S. Cl.
CPC ......... *G02B 6/1223* (2013.01); *G02B 6/1221* (2013.01); *G02B 6/134* (2013.01); *B82Y 20/00* (2013.01); *G02B 2006/12035* (2013.01)

(58) Field of Classification Search
CPC .... G02B 6/1223; G02B 6/1221; G02B 6/134; G02B 2006/12035; B82Y 20/00; C08K 9/04; G03F 7/0002; G03F 7/0005; G03F 7/0047; G03F 7/027; C08F 222/102
See application file for complete search history.

(56) References Cited

U.S. PATENT DOCUMENTS

| | | |
|---|---|---|
| 2021/0223686 A1 | 7/2021 | Joshi |
| 2022/0002574 A1 | 1/2022 | Guschl |
| 2024/0191056 A1* | 6/2024 | Guschl .............. C08F 222/1025 |

FOREIGN PATENT DOCUMENTS

WO     2022204586 A1    9/2022

OTHER PUBLICATIONS

International Search Report and Written Opinion received for PCT Application No. PCT/US2023/033912, Jan. 24, 2024, 12 pages.

\* cited by examiner

*Primary Examiner* — John Bedtelyon
(74) *Attorney, Agent, or Firm* — Workman Nydegger

(57) ABSTRACT

Disclosed is a nanoimprintable resin for use in optical waveguide applications. The nanoimprintable resin includes a base resin, metal oxide nanoparticles, and a photoinitiator. A cured film of the nanoimprintable resin exhibits a refractive index greater than or equal to 1.8 (589 nm), such as 1.9 (599 nm), according to ASTM D1218-21 at 25° C.

21 Claims, 2 Drawing Sheets

HIGH REFRACTIVE INDEX NANOIMPRINTABLE RESIN FOR OPTICAL WAVEGUIDE APPLICATIONS

BACKGROUND

The invention relates to a high refractive index nanoimprintable resin for use in optical waveguide applications. Waveguides have become increasingly useful for augmented reality (AR) and mixed reality (MR) devices. A waveguide display is a thin, transparent element used in AR/MR head-mounted devices to superimpose onto the viewer's physical world images presented by a projector in the device. Optical waveguides accomplish this by propagating a light field in a manner referred to as "total internal reflection." In this way, the optical waveguide bounces the light between inner and outer edges of the waveguide with minimal light leakage. Total internal reflection requires, among other things, a high refractive index material in the waveguide.

In AR/MR devices, a small projector within the head-mounted device, positioned out of the line of vision, projects an image onto a peripheral area of the display lens and the waveguide assists to propagate the image through the lens to an exit point that aligns with the position of the eye.

Waveguides have emerged as the best optical combiner for achieving the desired visual quality in a sufficiently compact form, without unwanted weight or bulk. Waveguides have historically been used in applications such as fiber optics, holograms, and more. Now they are the leading technology for enabling AR/MR visualization of images projected onto a viewer's real, physical environment.

Diffractive waveguides are one type of waveguide used in AR/MR devices. Such waveguides may be composed of a transparent substrate having a surface grating. Application of a coating to the transparent substrate allows for nanoscale imprinting of a surface grating onto the transparent substrate. In a waveguide, light rays propagate through the inner and outer edges of the waveguide until a portion of the light encounters the grating on the substrate surface and is diffracted out of the waveguide and released to the viewer's eyes. The remaining light will continue to propagate inside the waveguide until it also encounters the surface grating.

Towards this end, resins have become increasingly popular for use in fabricating optical waveguides. The fabrication process starts with micro/nano-fabrication, where methods such as electron beam lithography and ion beam etching create a stamp (i.e., mold). This stamp is then used to transfer a micro- or nanoscale grating pattern to a thin layer of resin coated on the surface of a transparent substrate. UV light (or other curing methods) then cures the imprinted resin before removing the stamp, leaving diffraction gratings on the substrate surface.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed herein is a nanoimprintable resin for use in optical waveguide applications. The nanoimprintable resin disclosed herein is intended to improve the manufacturing of optical gratings and surface relief grating structures for use in optical waveguides. The nanoimprintable resin includes a base resin, metal oxide nanoparticles, a photoinitiator, and potentially also solvent(s). The nanoimprintable resin exhibits a viscosity that is amenable to molding a nanoscale diffraction grating pattern in a film formed from the nanoimprintable resin. A cured film of the nanoimprintable resin exhibits a refractive index greater than or equal to 1.8 (589 nm), or greater than or equal to 1.85 (589 nm), or greater than or equal to 1.9 (589 nm), or greater than or equal to 1.95 (589 nm), according to ASTM D1218-21 at 25° C.

Also disclosed herein are substrates coated with the nanoimprintable resin and an optical waveguide comprising the nanoimprintable resin. Also disclosed herein is an augmented reality (AR) or mixed reality (MR) device manufactured by a process which incorporates the nanoimprintable resin.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
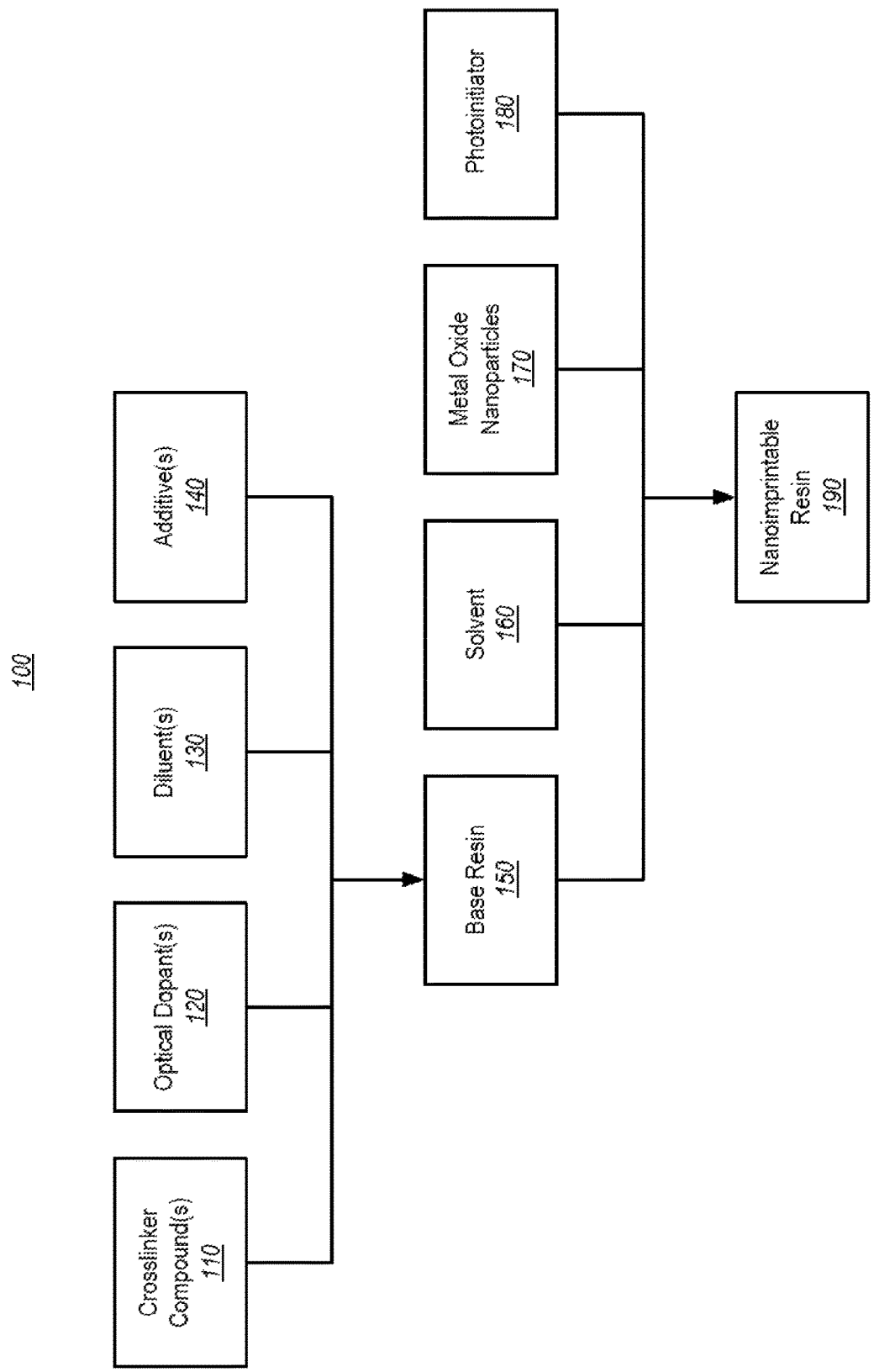
FIG. 1 illustrates a flow chart showing the elements of the nanoimprintable resin.
Figure 2A:
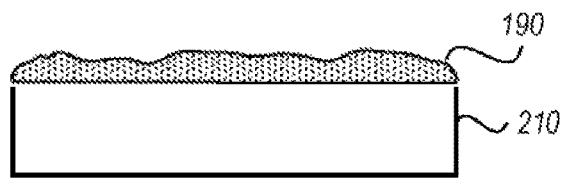
FIGS. 2A-2D illustrate a manufacturing process for an optical waveguide for incorporation into an AR device.
Figure 2B:
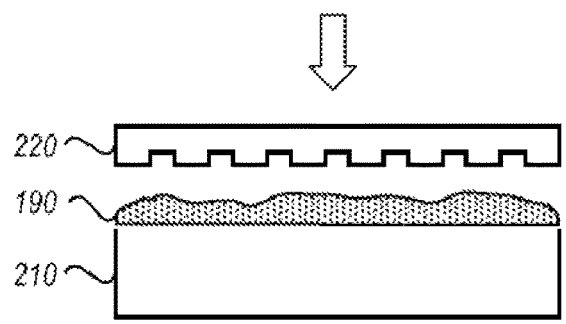
Figure 2C:
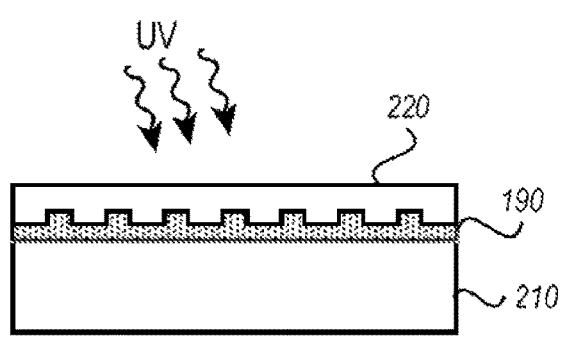
Figure 2D:
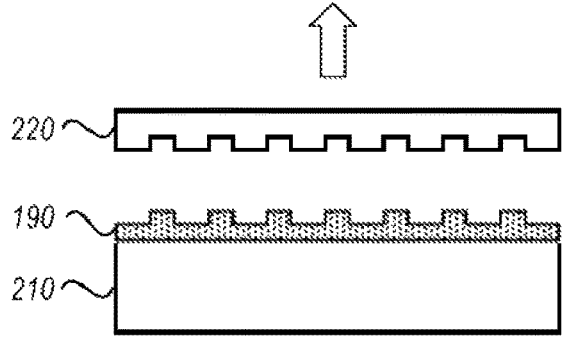

The following discussion now refers to a number of products, methods, and method acts (e.g., manufacturing steps) that may be performed. Although the method acts may be discussed in a certain order or illustrated in a flow chart as occurring in a particular order, no particular ordering is required unless specifically stated, or required because an act is dependent on another act being completed prior to the act being performed.

The invention relates to a high refractive index nanoimprintable resin for use in optical waveguide applications. Specifically, the nanoimprintable resin disclosed herein is intended to improve the manufacturing of optical gratings and surface relief grating structures for use in optical waveguides.

The goal of augmented reality (AR) and mixed reality (MR) devices is to provide high resolution images with a large field of view (FOV). The FOV is the angular viewing range that the AR/MR device covers. It is important because a larger FOV gives more of a sense of immersion and allows better accommodation with the viewer's eyes.

The FOV is limited by the refractive index of the materials in the waveguide (e.g., the transparent substrate and surface coating). Specifically, the FOV grows roughly proportional to the refractive index. High refractive index materials allow for more freedom in the optical design of diffractive waveguides. Furthermore, in traditional waveguides there tends to be a tradeoff between FOV and image resolution—a large FOV results in lower resolution images and vice versa. Thus, the goal of AR/MR devices is to optimize this balance and achieve a large FOV while retaining high resolution. Furthermore, there is tradeoff between the FOV and uniformity. The larger the FOV, the larger the waveguide and the more difficult to manufacture flat waveguides with uniform gratings. The present disclosure is directed towards solving these problems.

Disclosed herein is a high refractive index nanoimprintable resin for use in optical waveguide applications. The nanoimprintable resin possesses a high refractive index such that its incorporation into optical waveguides for AR/MR devices should result in high FOV, while retaining high resolution images.

The disclosed nanoimprintable resin, when in an uncured state, also possesses a viscosity which is amenable to molding a surface grating on a waveguide. A resin for use in waveguides must be able to fill the mold with nanoscale etchings and be amenable to removal of the mold from the cured resin without destroying the surface structures imprinted by the mold.

Also disclosed herein is a method for incorporating the nanoimprintable resin into optical waveguides. Also disclosed herein is a substrate coated at least in part with the nanoimprintable resin. The substrate may be, for example, a transparent glass. Example substrates to which the disclosed nanoimprintable resin may be applied include, but are not limited to glass, quartz, silicon dioxide, and/or flexible substrates like ITO/PET.

Base Resin

As shown, for example, in FIG. 1, the nanoimprintable resin 190 may be formed in part from a base resin 150. The base resin 150 may be mixed with metal oxide nanoparticles 170 and other materials to yield a high refractive index nanoimprintable resin 190 for use in waveguide applications. The base resin 150 may be formed from one or more crosslinker compounds 110, one or more optical dopants 120, and/or one or more diluents 130.

The crosslinker compounds 110 used to form the base resin 150 may be chosen so as to have a high refractive index, a high glass transition temperature (Tg), and/or a high viscosity. The crosslinker compounds 110 may also be chosen so as to impart to the base resin 150: a high refractive index, sufficient hardness, low shrinkage, and optimal scratch, abrasion, water, and/or chemical resistance. It is further desirable that the crosslinker compounds 110 be highly reactive and non-yellowing.

Towards this end, the crosslinker compounds 110 may possess (meth)acrylate functionality. As used herein, the term "(meth)acrylate" denotes acrylates and their methacrylate counterparts. The terms "(meth)acrylic" or "(meth) acrylate" are intended to cover both the acrylic/acrylate and methacrylic/methacrylate forms of the indicated material. For example, (meth)acrylate monomers can include acrylate monomers (without the methyl substitution) and/or methacrylate monomers. Further, a "(meth)acrylic" or "(meth) acrylate" compound/material is inclusive of acrylic acid forms, acrylic acid anhydride forms, and derivatives thereof. Such derivatives include C1-C5 alkyl esters of acrylic acids, lower alkyl-substituted acrylic acids (e.g., C1-C2 substituted acrylic acids, such as methacrylic acid and/or ethacrylic acid), and C1-C5 alkyl esters of lower alkyl-substituted acrylic acids (e.g., methyl methacrylate). The "acrylic" and "acrylate" forms of such compounds/materials are used interchangeably herein unless specified otherwise. The base resin 150 may be formed from both a di(meth)acrylate crosslinker and a tri(meth)acrylate crosslinker compound.

The di(meth)acrylate crosslinker may be one or more of hexanediol di(meth)acrylate, dipropyleneglycol di(meth) acrylate, bisphenol di(meth)acrylate, a di(meth)acrylate comprising a 9,9-diphenylfluorene skeleton, and/or bisphenol A epoxy diacrylate. The di(meth)acrylate crosslinker may be included at 1% to 5% by weight, or 1.5% to 4.5% by weight, or 2% to 4% by weight of the nanoimprintable resin 190, or any other range combination with endpoints defined by any two of the foregoing values.

The tri(meth)acrylate crosslinker may be one or more of trimethylolpropane triacrylate, dipentaerythritol hexaacrylate, pentaerythritol triacrylate, and/or a trimethacrylate of tris-2-hydroxyethyl isocyanurate. The tri(meth)acrylate crosslinker may be included at 0.2% to 2% by weight, or 0.5% to 1.5%, by weight, or 0.8% to 1.2% by weight of the nanoimprintable resin 190, or any other range combination with endpoints defined by any two of the foregoing values.

The base resin 150 may also incorporate an optical dopant 120 as a hole transport element. The optical dopant 120 may also be chosen so as to increase the refractive index of the base resin 150. Preferably, the optical dopant 120 has a high Tg and is high curing. The optical dopant 120 for forming the base resin 150 of the present invention may be one or more of divinyl benzene, 9-vinylcarbazole, and/or 1,4-diacryloyl piperazine. The optical dopant 120 may be included at 1% to 3% by weight, or 1.5% to 2.5% by weight of the nanoimprintable resin 190, or any other range combination with endpoints defined by any two of the foregoing values.

The base resin 150 may also include one or more diluent(s) 130 for controlling the grafting density of the base resin 150. The one or more diluents 130 may also be chosen so as to impart to the base resin 150: a refractive index of 1.4 or greater, and more preferably of 1.5 or greater; a high Tg; good adhesion and toughness; and/or optimal water, heat, and abrasion resistance. The one or more diluents 130 may be high curing and will preferably improve the transparency of the base resin 150. The diluents 130 may be one or more of a mono(meth)acrylate, allyl phenyl ether, and/or isobornyl (meth)acrylate. The one or more diluents 130 may be included at a total of 5% to 19% by weight, or 8% to 15% by weight, or 10% to 12% by weight of the nanoimprintable resin 190, or any other range combination with endpoints defined by any two of the foregoing values.

The base resin 150 may also include one or more additives 140 for (i) improving the dispersion of the metal oxide nanoparticles 170 and/or crosslinker compounds 110; (ii) reducing the viscosity of the nanoimprintable resin 190; and/or (iii) reducing the surface energy of overall formulation, thereby improving the release of the mold from the cured nanoimprintable resin 190 (shown in FIG. 2) in the nanoimprinting process. The additives 140 may include one or more of the formulations sold under the trade names Disperbyk-111, Disperbyk-108, Disperbyk-110, Disperbyk-118, BYK-UV 3500, BYK-UV-3518, BYK-UV 3519, BYK-UV 3575, BYK-UV 3510, or BYK-UV 3576, mono-2-

(Methacryloyloxy) ethyl succinate, 2-carboxyethyl acrylate, 2-(dimethylamino) ethyl methacrylate, and/or Bis[2-(methacryloyloxy)ethyl] phosphate. The one or more additives 140 may be included at a total of 0.18% to 3% by weight, or 0.5% to 2.5% by weight, or 1% to 2% by weight of the nanoimprintable resin 190, or any other range combination with endpoints defined by any two of the foregoing values.

The base resin 150 may substantially omit sulfur and/or halogens. Halogen-based resins, for example, can be associated with a high refractive index but are relatively expensive and introduce environmental issues. Sulfur-containing resins exhibit limited stability in the cured state, which affects the reliability and performance of the materials formed from them. Additionally, sulfur-based resins are prone to yellowing.

In one example, the viscosity of the uncured base resin 150 incorporating the aforementioned crosslinkers, optical dopants, diluents, and/or additives may be 14-15.8 centistokes at 25° C., as measured by Xylem AVS370 using an Uppelohde glass capillary kinematic viscometer. The density of the uncured base resin 150 may be 1.07-1.09 at 25° C., as measured by Density meter DMA4501. The refractive index of the uncured base resin 150 may be 1.4 (589 nm) or greater, and more preferably, 1.5 (589 nm) or greater, according to ASTM D1218-21 at 25° C.

Nanoimprintable Resin for Use in Waveguide Applications

As shown, for example, in FIG. 1, the base resin 150 may be mixed with (i) solvent 160, (ii) metal oxide nanoparticles 170, and/or (iii) a photoinitiator 180 to form the nanoimprintable resin 190. The base resin 150 may be included at 9% to 30% by weight of the nanoimprintable resin 190, such as 15% to 25%, or about 20% by weight of the nanoimprintable resin 190, or any range combination with endpoints defined by any two of the foregoing values.

The metal oxide nanoparticles 170 may be selected so as to improve the optical performance and refractive index of the nanoimprintable resin 190 for use in waveguide applications. The metal oxide nanoparticles 170 may be selected so as to have a higher refractive index than the base resin 150. In one example, the refractive index of the metal oxide nanoparticles 170 may be around 2 (e.g., between 1.95 and 2.05) and the refractive index of the waveguide or substrate may be around 1.6 (e.g., between 1.5 and 1.7). The metal oxide nanoparticles 170 may have an average particle size (volume basis) of 10 nm to 30 nm, such as 20 nm. The metal oxide nanoparticles 170 may be one or more of titanium dioxide, zirconium dioxide, barium titanate, hafnium oxide, niobium oxide, zinc oxide, cerium oxide, indium oxide, and/or a mixture of titanium dioxide with zirconium dioxide. The metal oxide nanoparticles 170 may be modified with (meth)acrylate functionality to enable crosslinking with the one or more crosslinker compounds 110 of the base resin 150. The metal oxide nanoparticles 170 may be included at 60% to 85% by weight of the nanoimprintable resin 190, such as 65% to 80%, or 70% to 75% by weight of the nanoimprintable resin 190, or any range combination with endpoints defined by any two of the foregoing values.

The base resin 150 may also be mixed with a photoinitiator 180, such that the resulting nanoimprintable resin 190 is photocurable. The photoinitiator 180 may be one or more of the photoinitiators sold under the trade names Omnirad 819, Omnirad 184, and/or Omnirad 2100. The photoinitiator 180 may be included at 1% to 5% by weight of the nanoimprintable resin 190, such as 2% to 4% or about 3% by weight of the nanoimprintable resin 190, or any range combination with endpoints defined by any two of the foregoing values.

The base resin 150 may also be mixed with solvent 160, in order to adjust the thickness of the nanoimprintable resin 190 such that it can be spin-coated or poured onto a transparent substrate for preparing an optical waveguide. The solvent 160 may be one or more of propylene glycol methyl ether (PGME), toluene, butyl acetate, amyl acetate, propylene glycol methyl ether acetate (PGMEA), and/or methyl ethyl ketone (MEK). The solvent 160 may be included at 10% to 25% by weight of the nanoimprintable resin 190, such as 15% to 20% by weight of the nanoimprintable resin 190, or any range combination with endpoints defined by any two of the foregoing values.

The nanoimprintable resin 190 may be formed by mixing the (i) base resin 150 formed by mixing one or more crosslinker compounds 110 with one or more optical dopants 120, one or more diluents 130, and/or one or more additives 140 with the (ii) solvent 160, (iii) metal oxide nanoparticles 170 functionalized to enable crosslinking with the one or more crosslinker compounds 110 of the base resin 150, and the (iv) photoinitiator 180.

In certain examples, the resulting nanoimprintable resin 190 may, in the uncured state, exhibit a viscosity of 3.0-4.0 centistokes at 25° C., such as 3.4-3.8 centistokes, as measured by Xylem AVS370 using an Uppelohde glass capillary kinematic viscometer, and/or a relative density of 1.1-1.4 at 25° C., as measured according to at least one of ASTM D4052, D5002, or ISO 12185. The resulting nanoimprintable resin 190, in the uncured state, may exhibit a refractive index of 1.4 (589 nm) or greater or, more preferably, 1.5 (589 nm) or greater, such as 1.54-1.55 (589 nm), according to ASTM D1218-21 at 25° C.

The nanoimprintable resin 190 may, in the cured state, exhibit one or more of: a contact angle of 89-96° (water) at 25° C.; for a 750-800 nm cured film on a glass substrate of 0.5 mm thickness when measured at 25° C. according to ASTM C1624-22, a hardness of 350-390 MPa; an elastic modulus of 11.4-13.0 Gpa; and/or an indentation creep of 14.0-14.9%. The nanoimprintable resin 190 may, in the cured state, exhibit a refractive index of 1.8 (589 nm) or greater, or of 1.85 (589 nm) or greater, or, more preferably, 1.9 (589 nm) or greater, such as 1.955-1.96 (589 nm), according to ASTM D1218-21 at 25° C.

Coated Substrate for Optical Waveguide

Referring to FIG. 2, an optical waveguide may be formed from the nanoimprintable resin 190 by spin coating, pouring, or otherwise applying the nanoimprintable resin 190 onto a transparent substrate 210. The substrate 210 may be glass, silicon, and/or a transparent polymer. After the nanoimprintable resin 190 has been applied to the surface of the substrate 210, the solvent 160 may be removed (e.g., by heat), leaving the nanoimprintable resin 190 uniformly distributed on the surface of the substrate 210, as shown in FIG. 2A. Then the nanoimprintable resin 190 may be stamped with a grating pattern composed of nanoscale features by pressing a mold 220 that includes the grating pattern against the nanoimprintable resin 190 such that a corresponding nanoscale pattern is formed in the nanoimprintable resin 190, as shown in FIG. 2B. The nanoimprintable resin 190 may then, as shown in FIG. 2C, be cured by applying ultraviolet (UV) light to the spin-coated (or poured) film. Finally, the mold 220 may be removed from the cured nanoimprintable resin 190 film, leaving the grating pattern corresponding to the mold 220 in the surface of the cured film on the glass substrate.

The nanoimprintable resin 190 disclosed herein allows the resin film to fill the nanoscale etchings in the mold 220 and to allow for release of the mold 220 from the cured film without disturbing the surface structures of the imprinted gratings.

In some embodiments, the refractive index of the cured nanoimprintable resin 190 may be the same, or similar to, that of the transparent substrate 210. In this way, the probability is reduced that light propagating within the waveguide would reflect from the interface between the nanoimprintable resin 190 and the transparent substrate 210. If light is reflected from the interface, rather than being emitted only when it interacts with the diffractive gratings, there is less uniformity in the performance of the optical waveguide.

Additional Terms & Definitions

Unless otherwise indicated, numbers expressing quantities, proportions, percentages, or other measurements used in the specification and claims are to be understood as optionally being modified by the term "about" or its synonyms, even if the term does not expressly appear. Any numerical range recited herein is intended to include all subranges subsumed therein. When ranges are given, any endpoints of those ranges and/or numbers within those ranges can be combined within the scope of the present disclosure.

Plural use of terms encompasses singular use of the terms and vice versa. For example, while the disclosed nanoimprintable resin has been described in terms of including "a" base resin and "a" photoinitiator, additional resin components and/or photoinitiators may be included.

When the term "about," "approximately," "substantially," "essentially," or the like are used in conjunction with a stated amount, value, or condition, it may be taken to mean an amount, value, or condition that deviates by 10% or less, 5% or less, 1% or less, 0.1% or less, or 0.01% or less from the stated amount, value, or condition. For example, a recited concentration of "about" X % includes values that differ from X (higher or lower) by up to 10%, up to 5%, up to 1%, up to 0.1%, or up to 0.01%.

The nanoimprintable resin disclosed herein should be understood as comprising/including disclosed components, and may therefore include additional components not specifically described. Optionally, the nanoimprintable resin disclosed herein is essentially free or completely free of components that are not specifically described, and thus may be understood as "consisting of" or "essentially consisting of" one or more expressly described components. In such cases, non-disclosed components may optionally be omitted or essentially omitted from the disclosed nanoimprintable resin. For example, a particular monomer that is not specifically described as being included in the disclosed nanoimprintable resin may be optionally excluded (i.e., essentially omitted or completely omitted).

A nanoimprintable resin that "essentially omits" or is "essentially free of" a component may include trace amounts and/or non-functional amounts of the component. For example, an "essentially omitted" component may be included in an amount no more than 10%, no more than 5%, no more than 2.5%, no more than 1%, no more than 0.1%, or no more than 0.01% by total weight of the nanoimprintable resin. This is likewise applicable to other negative modifier phrases such as, but not limited to, "essentially omits," "essentially without," similar phrases using "substantially" or other synonyms of "essentially," and the like.

Any headings and subheadings used herein are for organizational purposes only and are not meant to be used to limit the scope of the description or the claims.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A nanoimprintable resin for an optical waveguide, comprising:
   (a) a base resin comprising
      (i) one or more crosslinker compounds,
      (ii) one or more optical dopants, and
      (iii) one or more diluents; and
   (b) metal oxide nanoparticles dispersed within the base resin,
   wherein the metal oxide nanoparticles are functionalized to enable crosslinking with the one or more crosslinker compounds of the base resin, and
   wherein the nanoimprintable resin, when cured, exhibits a refractive index greater than or equal to 1.8 (589 nm) according to ASTM D1218-21 at 25° C.

2. The nanoimprintable resin of claim 1, wherein the nanoimprintable resin, when cured, exhibits a refractive index greater than or equal to 1.9 (589 nm) according to ASTM D1218-21 at 25° C.

3. The nanoimprintable resin of claim 1, wherein the one or more crosslinker compounds and the metal oxide nanoparticles comprise (meth)acrylate functionality.

4. The nanoimprintable resin of claim 1, wherein the one or more crosslinker compounds comprise both a di(meth)acrylate crosslinker and a tri(meth)acrylate crosslinker.

5. The nanoimprintable resin of claim 4, wherein:
   the di(meth)acrylate crosslinker comprises one or more of hexanediol di(meth)acrylate, dipropyleneglycol di(meth)acrylate, bisphenol di(meth)acrylate, a di(meth)acrylate comprising a 9,9-diphenylfluorene skeleton, or bisphenol A epoxy diacrylate; and/or
   the tri(meth)acrylate crosslinker comprises one or more of trimethylolpropane triacrylate, dipentaerythritol hexaacrylate, pentaerythritol triacrylate, or a trimethacrylate of tris-2-hydroxyethyl isocyanurate.

6. The nanoimprintable resin of claim 1, wherein the optical dopant comprises one or more of divinyl benzene, 9-vinylcarbazole, and 1,4-diacryloyl piperazine.

7. The nanoimprintable resin of claim 1, wherein the one or more diluents comprise one or more of a mono(meth)acrylate with a glass transition temperature of 140° C. or greater, a transparency enhancer, or a water, heat, and/or abrasion resistance enhancer.

8. The nanoimprintable resin of claim 7, wherein:
   the mono(meth)acrylate with a glass transition temperature of 140° C. or greater comprises one or more of N,N'-methylenediacrylamide, 4-acryloylmorpholine, or n-vinylpyrrolidone;
   the transparency enhancer comprises one or more of phenyl vinyl ether, allyl methyl ether, allyl phenyl ether, 2-allylphenol, allylbenzene, cyclohexyl vinyl ether, or allyl butyl ether; and/or the water, heat, and abrasion resistance enhancer comprises one or more of tetrahydrofurfuryl acrylate, phenoxyethyl acrylate, isobornyl acrylate, or isobornyl methacrylate.

9. The nanoimprintable resin of claim 1, further comprising one or more additives, the one or more additives comprising one or more of a nanoparticle dispersion enhancer, a mold release enhancer, or a viscosity reducer.

10. The nanoimprintable resin of claim 1, further comprising a photoinitiator such that the nanoimprintable resin is photocurable.

11. The nanoimprintable resin of claim 1, wherein the metal oxide nanoparticles have an average particle size (volume basis) of 10 nm to 30 nm.

12. The nanoimprintable resin of claim 1, further comprising a solvent, wherein the solvent comprises one or more of propylene glycol methyl ether (PGME), toluene, butyl acetate, amyl acetate, propylene glycol methyl ether acetate (PGMEA), and methyl ethyl ketone (MEK).

13. The nanoimprintable resin of claim 1, further comprising a solvent, wherein the nanoimprintable resin, when in an uncured state, exhibits:
   (i) a viscosity of 3.0-4.0 centistokes at 25° C., as measured by Xylem AVS370 using an Uppelohde glass capillary kinematic viscometer; and/or
   (ii) a relative density of 1.1-1.4 at 25° C., as measured according to at least one of ASTM D4052, D5002, or ISO 12185.

14. The nanoimprintable resin of claim 1, wherein the nanoimprintable resin, when in a cured state, exhibits one or more of:
   (i) a contact angle of 89-96° (water) at 25° C.; and/or
   for a 750-800 nm cured film on a glass substrate of 0.5 mm thickness when measured at 25° C. according to ASTM C1624-22,
   (ii) a hardness of 350-390 MPa;
   (iii) an elastic modulus of 11.4-13.0 Gpa; and/or
   (iv) an indentation creep of 14.0-14.9%.

15. The nanoimprintable resin of claim 1, wherein the base resin substantially omits sulfur and/or halogens.

16. An optical waveguide comprising the nanoimprintable resin of claim 1 in a cured state with a grating pattern formed thereon.

17. An augmented reality (AR) display comprising the optical waveguide of claim 16.

18. An augmented reality (AR) display, manufactured by a process comprising:
   adding the nanoimprintable resin of claim 1 to a transparent substrate;
   applying a mold comprising a grating pattern against the nanoimprintable resin such that a corresponding pattern is formed in the nanoimprintable resin;
   applying ultraviolet (UV) light to the nanoimprintable resin to cause curing of the nanoimprintable resin; and
   removing the mold from the cured nanoimprintable resin.

19. The AR display of claim 18, wherein:
   the nanoimprintable resin of claim 1 has a first refractive index and the transparent substrate has a second refractive index; and
   the first refractive index is the same as, or similar to, the second refractive index.

20. A photocurable nanoimprintable resin for an optical waveguide, comprising:
   (a) a base resin included at 9% to 30% by weight of the photocurable nanoimprintable resin, the base resin comprising
      (i) a set of crosslinker compounds comprising both a di(meth)acrylate crosslinker and a tri(meth)acrylate crosslinker,
      (ii) one or more optical dopants, and
      (iii) one or more diluents;
   (b) metal oxide nanoparticles dispersed within the base resin and included at 60% to 85% by weight of the photocurable nanoimprintable resin, the metal oxide nanoparticles comprising (meth)acrylate functionality to enable crosslinking with the one or more crosslinker compounds of the base resin;
   (c) a photoinitiator; and
   (d) a solvent included at 10% to 25% by weight of the photocurable nanoimprintable resin,
   wherein the nanoimprintable resin, when cured, exhibits a refractive index greater than or equal to 1.9 (589 nm) according to ASTM D1218-21 at 25° C.

21. A nanoimprintable resin for an optical waveguide, manufactured by a process comprising:
   (a) forming a base resin by mixing
      (i) one or more crosslinker compounds,
      (ii) one or more optical dopants, and
      (iii) one or more diluents; and
   (b) mixing the base resin with
      (i) a solvent,
      (ii) metal oxide nanoparticles functionalized to enable crosslinking with the one or more crosslinker compounds of the base resin, and
      (iii) a photoinitiator,
   wherein the nanoimprintable resin, when cured, exhibits a refractive index greater than or equal to 1.8 (589 nm) according to ASTM D1218-21 at 25° C.

* * * * *